US010923430B2

(12) United States Patent
Lin et al.

(10) Patent No.: US 10,923,430 B2
(45) Date of Patent: Feb. 16, 2021

(54) HIGH DENSITY CROSS LINK DIE WITH POLYMER ROUTING LAYER

(71) Applicants: ADVANCED MICRO DEVICES, INC., Santa Clara, CA (US); ATI TECHNOLOGIES ULC, Markham (CA)

(72) Inventors: Chun-Hung Lin, Hsinchu (TW); Rahul Agarwal, Livermore, CA (US); Milind Bhagavat, Los Altos, CA (US); Fei Guo, Ottawa (CA)

(73) Assignees: ADVANCED MICRO DEVICES, INC., Santa Clara, CA (US); ATI TECHNOLOGIES ULC, Markham (CA)

(*) Notice: Subject to any disclaimer, the term of this patent is extended or adjusted under 35 U.S.C. 154(b) by 0 days.

(21) Appl. No.: 16/458,094

(22) Filed: Jun. 30, 2019

(65) Prior Publication Data
US 2020/0411443 A1 Dec. 31, 2020

(51) Int. Cl.
*H01L 21/56* (2006.01)
*H01L 23/538* (2006.01)
*H01L 23/31* (2006.01)
*H01L 23/498* (2006.01)
*H01L 23/00* (2006.01)

(52) U.S. Cl.
CPC ........ *H01L 23/5386* (2013.01); *H01L 21/566* (2013.01); *H01L 23/3157* (2013.01); *H01L 23/49816* (2013.01); *H01L 24/09* (2013.01); H01L 2224/02371 (2013.01)

(58) Field of Classification Search
CPC ............ H01L 23/5386; H01L 23/3157; H01L 23/49816; H01L 21/566; H01L 24/09; H01L 2224/02371
USPC ........................................................ 257/773
See application file for complete search history.

(56) References Cited

U.S. PATENT DOCUMENTS

| 5,998,243 A | 12/1999 | Odashima et al. |
| 6,258,626 B1 | 7/2001 | Wang et al. |
| 6,339,254 B1 | 1/2002 | Venkateshwaran et al. |
| 6,468,833 B2 | 10/2002 | Uner et al. |

(Continued)

FOREIGN PATENT DOCUMENTS

| EP | 1909546 A1 | 4/2008 |
| WO | WO2006134914 A1 | 12/2006 |
| WO | WO2017111957 | 6/2017 |

OTHER PUBLICATIONS

U.S. Appl. No. 16/778,815, filed Jan. 31, 2020, Milind S. Bhagavat et al.

(Continued)

Primary Examiner — Tong-Ho Kim

(57) ABSTRACT

Various multi-die arrangements and methods of manufacturing the same are disclosed. In one aspect, a semiconductor chip device is provided that includes a first molding layer and an interconnect chip at least partially encased in the first molding layer. The interconnect chip has a first side and a second side opposite the first side and a polymer layer on the first side. The polymer layer includes plural conductor traces. A redistribution layer (RDL) structure is positioned on the first molding layer and has plural conductor structures electrically connected to the plural conductor traces. The plural conductor traces provide lateral routing.

18 Claims, 12 Drawing Sheets

(56) References Cited

U.S. PATENT DOCUMENTS

| | | |
|---|---|---|
| 6,576,540 B2 | 6/2003 | Hsu et al. |
| 6,583,502 B2 | 6/2003 | Lee et al. |
| 6,593,662 B1 | 7/2003 | Pu et al. |
| 6,717,253 B2 | 4/2004 | Yang |
| 6,820,329 B2 | 11/2004 | Fang |
| 6,853,064 B2 | 2/2005 | Bolken et al. |
| 6,853,084 B2 | 2/2005 | Hsu et al. |
| 6,916,685 B2 | 7/2005 | Yang et al. |
| 7,041,591 B1 | 5/2006 | Lee et al. |
| 7,057,277 B2 | 6/2006 | Chen et al. |
| 7,081,402 B2 | 7/2006 | Hsu et al. |
| 7,109,576 B2 | 9/2006 | Bolken et al. |
| 7,198,980 B2 | 4/2007 | Jiang et al. |
| 7,396,753 B2 | 7/2008 | Chu et al. |
| 7,399,399 B2 | 7/2008 | Chou et al. |
| 7,485,970 B2 | 2/2009 | Hsu et al. |
| 7,528,474 B2 | 5/2009 | Lee |
| 7,545,048 B2 | 6/2009 | Meyer et al. |
| 7,554,203 B2 | 6/2009 | Zhou et al. |
| 7,799,608 B2 | 9/2010 | Chan et al. |
| 8,298,945 B2 | 10/2012 | Leung et al. |
| 8,901,748 B2 | 12/2014 | Manusharow et al. |
| 8,946,900 B2 | 2/2015 | Qian et al. |
| 9,059,179 B2 | 6/2015 | Karikalan et al. |
| 9,223,541 B2 | 12/2015 | Barakat |
| 9,240,377 B2 | 1/2016 | Qian et al. |
| 9,324,687 B1 * | 4/2016 | Kelkar .................... H01L 25/50 |
| 9,443,824 B1 | 9/2016 | We et al. |
| 9,542,522 B2 | 1/2017 | Qian et al. |
| 2002/0006686 A1 | 1/2002 | Cloud et al. |
| 2002/0172026 A1 | 11/2002 | Chong et al. |
| 2003/0016133 A1 | 1/2003 | Egbert |
| 2003/0111733 A1 | 6/2003 | Pogge et al. |
| 2004/0106229 A1 | 6/2004 | Jiang et al. |
| 2009/0135574 A1 | 5/2009 | Tanaka et al. |
| 2011/0010932 A1 | 1/2011 | Tanaka et al. |
| 2011/0285006 A1 | 11/2011 | Weng et al. |
| 2012/0007211 A1 | 1/2012 | Aleksov et al. |
| 2012/0110217 A1 | 5/2012 | Christiansen et al. |
| 2012/0286419 A1 | 11/2012 | Kwon et al. |
| 2013/0049127 A1 | 2/2013 | Chen et al. |
| 2013/0168854 A1 | 7/2013 | Karikalan et al. |
| 2014/0102768 A1 | 4/2014 | Shizuno et al. |
| 2014/0159228 A1 | 6/2014 | Teh et al. |
| 2014/0185264 A1 | 7/2014 | Chen et al. |
| 2014/0264791 A1 | 9/2014 | Manusharow et al. |
| 2014/0264831 A1 | 9/2014 | Meyer |
| 2014/0332966 A1 | 11/2014 | Xiu et al. |
| 2015/0001717 A1 | 1/2015 | Karhade et al. |
| 2015/0001733 A1 | 1/2015 | Karhade et al. |
| 2015/0048515 A1 | 2/2015 | Zhang et al. |
| 2015/0092378 A1 | 4/2015 | Roy et al. |
| 2015/0171015 A1 | 6/2015 | Mahajan et al. |
| 2015/0181157 A1 | 6/2015 | Kuo et al. |
| 2015/0228583 A1 | 8/2015 | Karhade et al. |
| 2015/0311182 A1 | 10/2015 | Lee et al. |
| 2015/0340459 A1 | 11/2015 | Lee |
| 2016/0085899 A1 | 3/2016 | Qian et al. |
| 2016/0133571 A1 | 5/2016 | Lee et al. |
| 2016/0181189 A1 | 6/2016 | Qian et al. |
| 2017/0207204 A1 | 7/2017 | Lin et al. |
| 2019/0020343 A1 * | 1/2019 | Lee ..................... H01L 23/5389 |
| 2019/0051621 A1 * | 2/2019 | Liu ......................... H01L 23/31 |
| 2019/0051633 A1 * | 2/2019 | Bhagavat ................ H01L 24/19 |
| 2019/0164936 A1 * | 5/2019 | Agarwal ............. H01L 23/5389 |

OTHER PUBLICATIONS

Tom Krazit; *Intel shows off 80-core processor*; http://news.com.com/Intel+shows+off+80-core+processor/2100-1006_3; Feb. 11, 2007; pp. 1-3.

Ron Huemoeller et al.; *Silicon wafer integrated fan-out technology*; ChipScaleReview.com; Mar./Apr. 2015; pp. 1-4.

Wikipedia; *Physical Layer*; https://en.wikipedia.org/wiki/Physical_layer; Jan. 2015; pp. 1-5.

USPTO Office Action notification dated Feb. 7, 2019; U.S. Appl. No. 15/961,222.

USPTO Office Action notification dated Aug. 21, 2019; U.S. Appl. No. 15/961,222.

* cited by examiner

HIGH DENSITY CROSS LINK DIE WITH POLYMER ROUTING LAYER

BACKGROUND OF THE INVENTION

A conventional type of multi-chip module includes two semiconductor chips mounted side-by-side on a carrier substrate or in some cases on an interposer (so-called "2.5D") that is, in-turn, mounted on a carrier substrate. The semiconductor chips are flip-chip mounted to the carrier substrate and interconnected thereto by respective pluralities of solder joints. The carrier substrate is provided with plural electrical pathways to provide input/output pathways for the semiconductor chips both for inter-chip power, ground and signal propagation as well as input/output from the interposer itself. The semiconductor chips include respective underfill material layers to lessen the effects of differential thermal expansion due to differences in the coefficients of thermal expansion of the chips, the interposer and the solder joints.

One conventional variant of 2.5D interposer-based multi-chip modules uses a silicon interposer with multiple internal conductor traces for interconnects between two chips mounted side-by-side on the interposer. The interposer is manufactured with multitudes of through-silicon vias (TSVs) to provide pathways between the mounted chips and a package substrate upon which the interposer is mounted. The TSVs and traces are fabricated using large numbers of processing steps.

Another conventional multi-chip module technology is 2D wafer-level fan-out (or 2D WLFO). Conventioal 2D WLFO technology is based on embedding die into a molded wafer, also called "wafer reconstitution." The molded wafer is processed through a standard wafer level processing flow to create the final integrated circuit assembly structure. The active surface of the dies are coplanar with the mold compound, allowing for the "fan-out" of conductive copper traces and solder ball pads into the molded area using conventional redistribution layer (RDL) processing. Conventional 3D WLFO extends the 2D technology into multi-chip stacking where a second package substrate is mounted on the 2D WLFO.

Some other conventional designs use embedded interconnect bridges (EMIB). These are typically silicon bridge chips (but occasionally organic chiplets with top side only input/outputs) that are embedded in the upper reaches of a package substrate.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
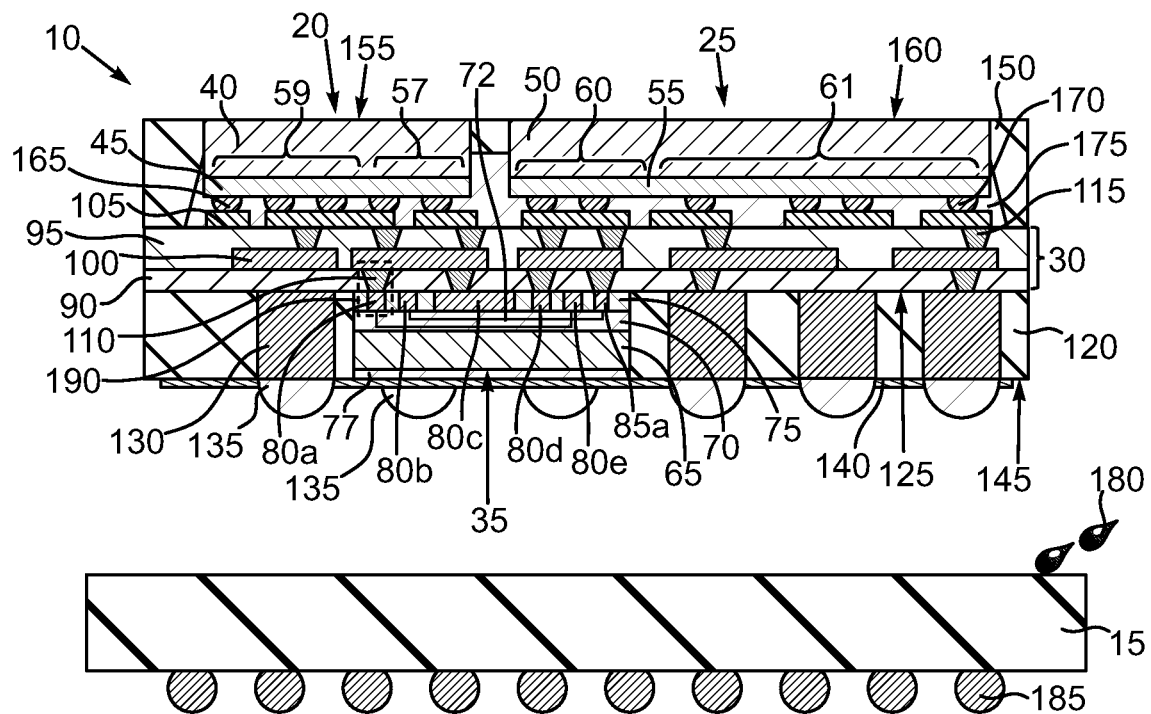
FIG. 1 is a sectional view of an exemplary arrangement of a semiconductor chip device with an interconnect chip but shown exploded from an exemplary circuit board.

Chip geometries have continually fallen over the past few years. However the shrinkage in chip sizes has been accompanied by an attendant increase in the number of input/outputs for a given chip. This has led to a need to greatly increase the number of chip-to-chip interconnects for multi-chip modules. Current 2D and 3D WLFO have limited minimum line spacing, on the order of 2.0 μm/fine and space. Some conventional multi-chip module designs use a high density cross-link (HDCL) die to provide high speed chip-to-chip interconnections. A typical conventional HDCL die includes a substrate portion and a high speed interconnect portion fabricated on the substrate portion. The high speed interconnect portion includes multitudes of very thin and narrow conductor traces. In a typical HDCL assembly, a thick RDL overlies the high speed interconnect portion of the HDCL die and is used mainly for power delivery. To reduce the cost and improve yield, a single layer RDL is often used. A polyimide layer is interposed between the high speed interconnect portion and the overlying thick RDL. Plural conductor studs are dispersed in the polyimide layer to make connections between the thick RDL and the underlying high speed interconnect portion of the HDCL die. These conductor studs provide vertical routing only. The lateral routing is provided by the high speed interconnect portion.

The disclosed arrangements take advantage of the presence of the polyimide layer. Scores of conductor traces are fabricated in the polyimide (or other polymer) layer to provide lateral routing. The conductor traces can be much thicker and wider than the traces in a conventional high speed interconnect portion of a HDCL die, and thus lead to lower $I^2R$ losses. In some arrangements, the conductor traces in the polymer layer can replace altogether the high speed interconnect portion of the HDCL die. In these circumstances, the path length to the overlying RDL is smaller, which provides reduced inductance. Moreover, the HDCL die can be constructed as a dummy component to provide mechanical support only. Yield issues for dummy components are quite small compared to typical full-blown HDCL dies. The new traces can be beneficially used for both DC and AC power delivery.

In accordance with one aspect of the present invention, a semiconductor chip device is provided that includes a first molding layer and an interconnect chip at least partially encased in the first molding layer. The interconnect chip has a first side and a second side opposite the first side and a polymer layer on the first side. The polymer layer includes plural conductor traces. A redistribution layer (RDL) structure is positioned on the first molding layer and has plural conductor structures electrically connected to the plural conductor traces. The plural conductor traces provide lateral routing.

In accordance with another aspect of the present invention, a method of manufacturing a semiconductor chip device is provided. The method includes fabricating an interconnect chip that has a first side and a second side opposite the first side and a polymer layer on the first side. The polymer layer includes plural conductor traces. A first molding layer is fabricated around the interconnect chip. A redistribution layer (RDL) structure is fabricated on the first molding layer. The RDL structure has plural conductor structures electrically connected to the plural conductor traces. The plural conductor traces provide lateral routing.

In accordance with another aspect of the present invention, a method of interconnecting a first semiconductor chip to a second semiconductor chip is provided. The method includes at least partially encasing an interconnect chip in a first molding layer. The interconnect chip has a first side and a second side opposite the first side and a polymer layer on the first side. The polymer layer includes plural conductor traces. A redistribution layer (RDL) structure is fabricated on the first molding layer. The RDL structure has plural conductor structures electrically connected to the plural conductor traces. The plural conductor traces provide lateral routing. A first semiconductor chip and a second semiconductor chip are mounted on the RDL structure after the RDL structure is fabricated. The first semiconductor chip is interconnected to the second semiconductor chip with the interconnect chip and the RDL structure.

In the drawings described below, reference numerals are generally repeated where identical elements appear in more than one figure. Turning now to the drawings, and in particular to FIG. 1 which is a sectional view of an exemplary semiconductor chip device 10 that can be mounted on another device such as a circuit board 15. As described in more detail below, the semiconductor chip device 10 can be constructed using a die-last type process flow. The semiconductor chip device 10 can include two or more semiconductor chips 20 and 25 that are mounted on and electrically interconnected by a RDL structure 30 and an interconnect chip 35. The semiconductor chips 20 and 25 can be any of a variety of integrated circuits. A non-exhaustive list of examples includes microprocessors, graphics processing units, application processing units that combines aspects of both, memory devices, an application integrated specific circuit or other. The semiconductor chip 20 includes a substrate portion 40 and an interconnect portion 45. The substrate portion 40 includes multitudes of logic and other circuits and can consist of silicon, germanium, or other types of semiconductor materials, and can include various dielectric materials. The interconnect portion 45 can consist of one or more layers of metallization and interlevel dielectric materials. The semiconductor chip 25 similarly consists of a substrate portion 50 and an interconnect portion 55. The semiconductor chip 20 is constructed with a physical layer or "PHY" region 57, which has various internal and external conductor structures dedicated to the transmission of chip-to-chip signals, and a non-PHY region 59, which has conductor structures that are tailored more to the conveyance of power and ground and/or chip-to-circuit board signals. The semiconductor chip 25 similarly includes a PHY region 60 and a non-PHY region 61 that had the same functions as the PHY region 57 and the non-PHY region 59 of the semiconductor chip 20.

As noted briefly above, the semiconductor chips 20 and 25 are connected electrically by way of another semiconductor chip, namely, an interconnect chip 35. The interconnect chip 35 includes a substrate portion 65 and an interconnect portion 70 that can be like the corresponding portions of the semiconductor chips 20 and 25. The semiconductor chips 20 and 25 and the interconnect chip 35 can be constructed of silicon, germanium or other semiconductor materials and be bulk semiconductor, semiconductor on insulator or other designs. The interconnect chip 35 includes multitudes of conductor traces, a few of which are depicted and numbered 72, which can be on multiple levels or a single level as desired. The conductor traces 72 interface electrically with conductor structures of the PHY regions 57 and 60 of the semiconductor chips 20 and 25 by way of conducting pathways. The interconnect portions 45, 55 and 70 of the semiconductor chips 20 and 25 and the interconnect chip 35, respectively, can have outermost passivation structures (not visible) that can be a laminate of various insulating materials such as, silicon oxides, silicon nitride, or other dielectric materials.

A polymer layer 75 is fabricated on the interconnect portion 70 of the interconnect chip 35. In a conventional design, the conductor traces 72 of the interconnect chip 35 would be electrically connected to the RDL structure 30 by a collection of copper studs in the polymer layer 75 that extend from the interconnect portion 70 to the RDL structure 30. These conventional copper studs provide vertical interconnections only. However, in this illustrative arrangement, the polymer layer 75 is used for lateral routing in addition to vertical connections. To this end, conductor traces 80a, 80b, 80c, 80d and 80e are positioned in the polymer layer 75 to provide lateral routing. While only a few traces 80a, 80b, 80c, 80d and 80e are depicted, there can be hundreds or thousands of such traces. The traces 80a, 80b, 80c, 80d and 80e can be accompanied by plural conductor studs, such as the conductor stud 85a shown, but there can be hundreds or thousands of such studs. Additional details of the polymer layer 75 and the conductor traces will be described below. A die attach film 77 is positioned below the substrate portion 65 of the interconnect chip 35.

The RDL structure 30 includes one or more dielectric layers, two of which are shown in this illustrative arrangement and numbered 90 and 95, respectively, and various metallization structures. The dielectric layers 90 and 95 are preferably composed of polybenzoxazoles, although other polymeric materials could be used, such as benzocyclobutene, high or low temperature polyimide or other polymers. Since the RDL structure 30 is fabricated before the chips 20 and 25 are mounted thereon, polymer curing temperatures above 200° C. can be used. The dielectric layers 90 and 95 are designed to act as stress buffers and isolation films and to enable redistribution layer routing. For example, the RDL structure 30 includes a metallization layer of plural conductor pads/traces 100 fabricated on the dielectric layer 90 and another metallization layer of plural conductor pads/traces 105 fabricated on the dielectric layer 95. The pads/traces 100 and 105 convey power, ground and/or signals. Plural conductive vias 110 are interspersed in the dielectric layer 90 to connect the pads/traces 100 to underlying conductors, such as the conductor traces 80a, 80b, 80c and 80d and the stud 85a. Another plurality of vias 115 are interspersed in the dielectric layer 95 to connect the pads/traces 100 to overlying conductors, such as the pads/traces 105. The pads/traces 105 are fabricated with design rules for small spacings associated with the I/O mappings of the chips 20 and 25.

The interconnect chip 35 and the polymer layer 75 are at least partially encased in a molding layer 120. The RDL structure 30 is fabricated on a side 125 of the molding layer 120. Plural conductive pillars 130 are positioned in the molding layer 120. The conductive pillars 130 are connected to the RDL structure 30 by way of the vias 110 and to the circuit board 15 by way of solder structures 135. The solder structures 135 can be bumps, balls or the like. Note that some of the conductive pillars 130 are shown in section, but others, such as those deeper into the page than the interconnect chip 35, are obscured. Note also that some of the solder structures are shown in section, but others, such as those deeper into the page than the interconnect chip 35, are not shown in section. A polymer layer 140 is fabricated on a side 145 of the molding layer 120. The polymer layer is preferably capable of being photolithographically patterned to form openings to accommodate the solder structures. Exemplary materials for the polymer layer include polybenzoxazoles, although other polymeric materials could be used, such as benzocyclobutene, high or low temperature polyimide or other polymers.

Note that the conductive pillars 130 and solder structures 135 are fabricated with different design rules than the pads/traces 100 and 105 and vias 110 and 115 of the RDL structure 30 and thus are quite a bit larger than those structures. However, the RDL structure 30 provides a size transition interconnect system between the relatively large conductive pillars 130 and the much smaller interconnects associated with the semiconductor chips 20 and 25. In this regard, the semiconductor chip 20, and in particular the interconnect portion 45 thereof, is connected to the pads/traces 105 directly or by way of plural interconnect structures 165, which can be solder bumps, micro bumps, metal pillars or others. The chip 25, and in particular the interconnect portion 55 thereof, is similarly connected to various of the pads/traces 105 by way of plural interconnect structures 170, which can be like the interconnect structures 165. It is desirable for the materials selected for the molding layers 120 and 150 to exhibit suitable viscosity at the applicable molding temperatures and have molding temperatures lower than the melting points of any of the solder structures present at the time of the molding processes. In an exemplary arrangement the materials for the molding layers 120 and 150 can have a molding temperature of about 165° C. Two commercial variants are Sumitomo EME-G750 and G760. To cushion against the effects of mismatched coefficients of thermal expansion, an underfill material 175 can be positioned between the semiconductor chips 20 and 25 and the RDL structure 30 and can extend laterally beyond the left and right edges (and those edges not visible) of the chips 20 and 25 as desired. The underfill material 175 can be composed of well-known polymeric underfill materials, such as epoxies or others.

The conductor structures of the RDL structure 30, the conductor structures of the interconnect portion 70, and the conductor structures of the polymer layer 75 and other conductors disclosed herein can be composed of various conductor materials, such as copper, aluminum, silver, gold, platinum, palladium, laminates of these or others. The solder structures 130 and the interconnect structures 165 and 170 and other solder structures disclosed herein can be composed of various well-known solder compositions, such as tin-silver, tin-silver-copper or others.

None of the arrangements disclosed herein is reliant on particular functionalities of the semiconductor chips 20 and 25 or the circuit board 15. Thus, the semiconductor chips 20 and 25 can be any of a variety of different types of circuit devices used in electronics, such as, for example, interposers, microprocessors, graphics processors, combined microprocessor/graphics processors, application specific integrated circuits, memory devices or the like, and can be single or multi-core. The semiconductor chips 20 and 25 can be constructed of bulk semiconductor, such as silicon or germanium, or semiconductor-on-insulator materials, such as silicon-on-insulator materials or even insulator materials. Thus, the term "semiconductor chip" even contemplates insulating materials. Stacked dice can be used if desired.

The circuit board 15 can be organic or ceramic and single, or more commonly, multilayer. Variations include package substrates, system boards, daughter boards, circuit cards and others. To cushion against the effects of mismatched coefficients of thermal expansion, an underfill material 180 can be positioned between the polymer layer 140 and the upper surface of the circuit board 15 and can extend laterally beyond the left and right edges (and those edges not visible) of the molding layer 120 as desired. The underfill material 180 can be composed of well-known polymeric underfill materials. The circuit board 15 can include I/Os 185 to interface with another device (not shown). The I/Os 185 can be solder balls or bumps, pins or others.

Note the location of the dashed rectangle 190 in FIG. 1. The dashed rectangle 190 circumscribes the conductor trace 80a, one of the vias 110 and a small portion of one of the conductor traces 72 in the interconnect portion 70 of the interconnect chip 35. Attention is turned now to FIG. 2, which is that portion of FIG. 1 circumscribed by the dashed rectangle 190 but shown at greater magnification. As noted above, the conductor trace 80a is positioned in the polymer layer 75. The via 110 is formed in ohmic contact with the conductor trace 80*a* and is disposed in the dielectric layer 90. A portion of one of the overlying pads/traces 100 is shown in electrical contact with the via 110. One of the conductor traces 72 of the interconnect portion 70 is electrically connected to the overlying conductor trace 80*a* by way of a via 200 and a conductor pad 205 formed on the via 200. It is possible to eliminate the conductor pad 205 and form the conductor trace 80*a* directly in contact with the via 200 if desired. This illustrative conductor arrangement can be used for the other connections between the conductor traces 80*b*, 80*c*, etc. and overlying conductor structures and underlying conductor structures as well.

Figure 3:
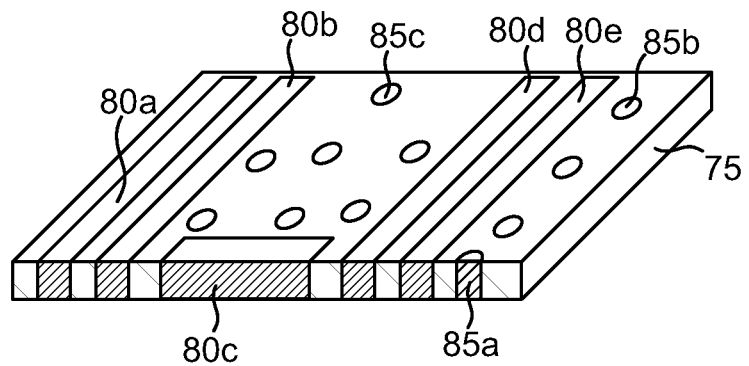
FIG. 3 is a combined sectional and pictorial view of an exemplary polymer layer from the semiconductor chip device of FIG. 1.

Additional details of the polymer layer 75 can be understood by referring now to FIG. 3, which is a pictorial view of the polymer layer 75 exploded from the semiconductor chip device 10 depicted in FIG. 1. The polymer layer 75 is shown in section as well such that the conductor traces 80*a*, 80*b*, 80*c*, 80*d* and 80*e* are shown in section as well as the conductor stud 85*a*. Note that a few additional conductor studs 85*b* and 85*c*, for example, are also shown. Here, the conductor traces 80*a*, 80*b*, 80*d* and 80*e* extend generally through the polymer layer 75 along a direction generally in and out of the page, while one or more of the conductor traces such as the trace 80*c* extends in a different direction, namely parallel to the page. Of course the skilled artisan will appreciate that the conductor traces 80*a*, 80*b*, 80*c*, 80*d* and 80*e* can take on virtually any footprint and trace pathways, such as straight, bent, curved, zigzag, etc. It should be understood that the conductor traces 80*a*, 80*b*, 80*c*, 80*d* and 80*e* and the studs 85, 85*b* and 85*c* can be used for conveyance of power ground signals differential signaling or other uses.

Figure 4:
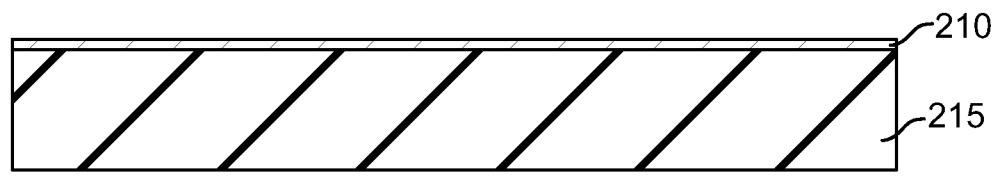
FIG. 4 is a sectional view depicting an exemplary carrier wafer and release layer.
Figure 5:
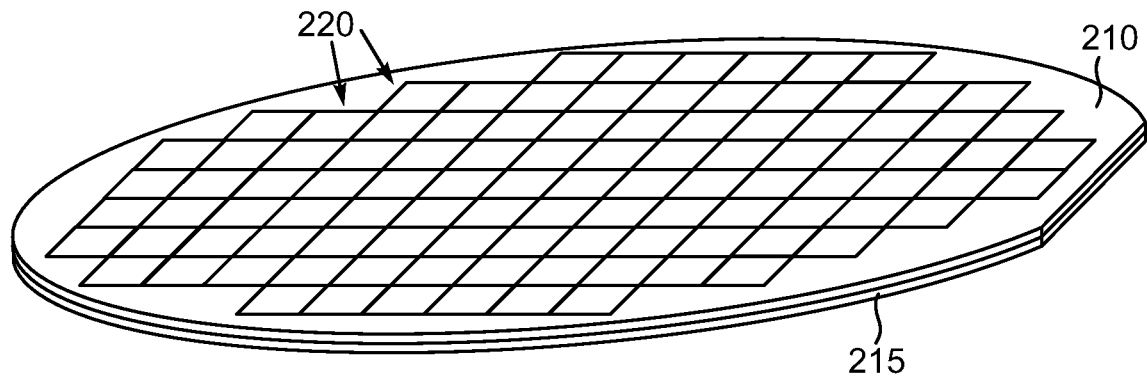
FIG. 5 is a pictorial view of an exemplary wafer level processing using a carrier wafer and the release layer.

An exemplary process flow for fabricating the semiconductor chip device 10 can be understood by referring now to FIGS. 4 to 22 and initially to FIG. 4. The initial stages of the fabrication process entail a process to produce the conductive pillars 130 and another process to fabricate the interconnect chip 35. The following description will focus first on the creation of the conductive pillars 130, but it should be understood that the creation of the interconnect chip 35 can come first or be done in parallel. The process begins with the fabrication of the structures associated with the conductive pillars 130 shown in FIG. 1. As shown in FIG. 4, a release layer 210 is applied to a carrier wafer 215. The release layer 210 can be a light activated, thermally activated, or other type of adhesive or even some form of tape that can enable the carrier wafer 215 to be removed without destructively damaging the structures mounted thereon at the time of separation. The carrier wafer 215 can be composed of various types of glasses or even semiconductors, such as silicon. This and subsequent processing can be performed on a wafer level as depicted in FIG. 5, which shows the release layer 210 applied to the carrier wafer 215.

Figure 6:
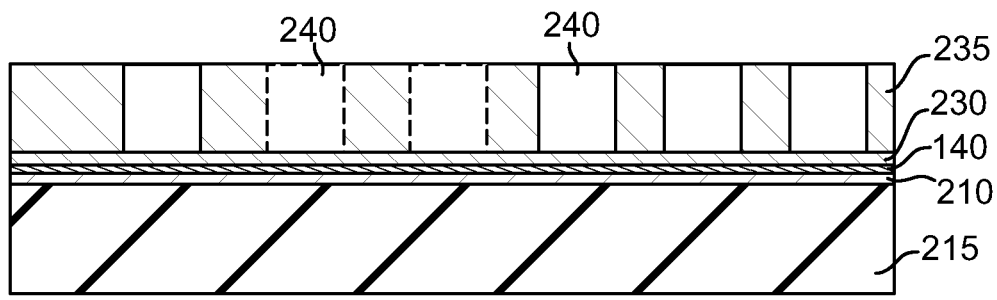
FIG. 6 is a sectional view like FIG. 4 but depicting initial processing of conductive pillars.

The rectangular boxes 220 represent schematically the locations where individual molded packages will be singulated in subsequent processing. As shown in FIG. 6, the polymer layer 140 is applied to the release layer 210. The dielectric layer 140 can be applied using spin coating or the like. A plating seed layer 230 is applied to the polymer layer 140. The plating seed layer 230 can be composed of a variety of materials that are suitable for plating seed layers, such as copper or the like, and applied by well-known sputtering, chemical vapor deposition, electroless plating or the like. A photolithography mask 235 is applied to the plating seed layer 230 and patterned photolithographically to produce plural openings 240, which will be used to plate the conductive pillars 130 shown in FIG. 1. The photolithography mask 235 can be composed of negative tone or positive tone resist as desired. Note that some of the openings 240 are not in the same plane as others and thus are shown in phantom. The openings 240 shown in phantom will be the locations where, for example, conductive pillars 130 shown in FIG. 1 that are behind the interconnect chip 35 will be mounted. For simplicity of illustration, the plating seed layer 230 will not be shown in other figures.

Figure 7:
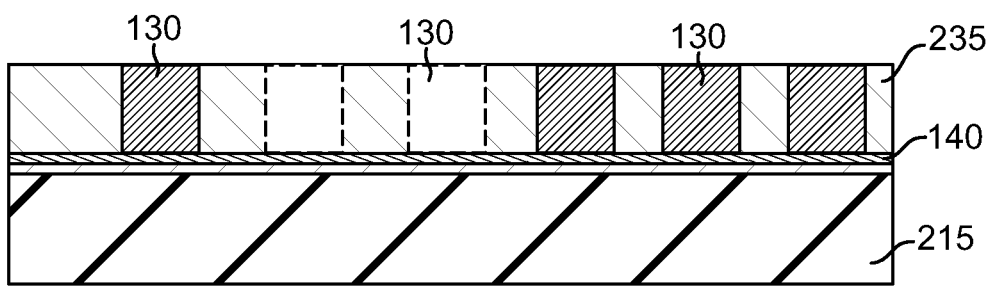
FIG. 7 is a sectional view like FIG. 6 but depicting additional exemplary processing of conductive pillars.
Figure 8:
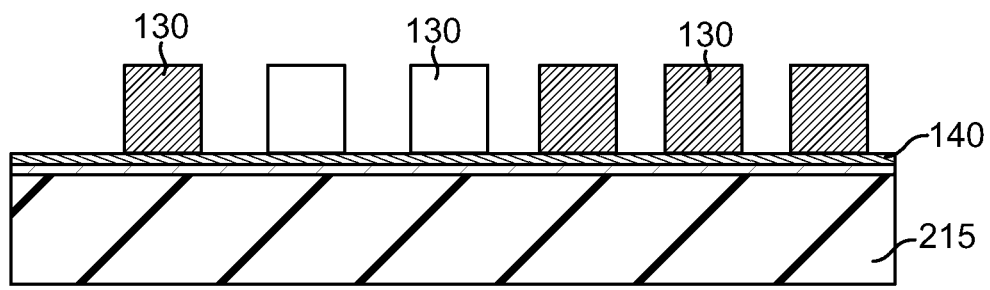
FIG. 8 is a sectional view like FIG. 7 but depicting mask removal from exemplary conductive pillars.

As shown in FIG. 7, with the photolithography mask 260 in place and patterned, a plating process is performed to fabricate the conductive pillars 130. The plating process is preferably a biased plating process. Next, and as shown in FIG. 8, the photolithography mask 235 shown in FIG. 7 is stripped using ashing, solvent stripping or the like to yield the conductive pillars 130 positioned in the polymer layer 140. Portions of the plating seed layer (not shown) on the polymer layer 140 lateral to the pillars 130 are etched using well-known etch techniques. Note that some of the conductive pillars 130 are not in the same plane as others and thus are not shown in section. The pillars 130 not shown in section (but shown in phantom) will be behind where the interconnect chip 35 shown in FIG. 2 will be mounted. The carrier wafer 215 and polymer layer 140 are now ready to receive the interconnect chip 35.

Figure 9:
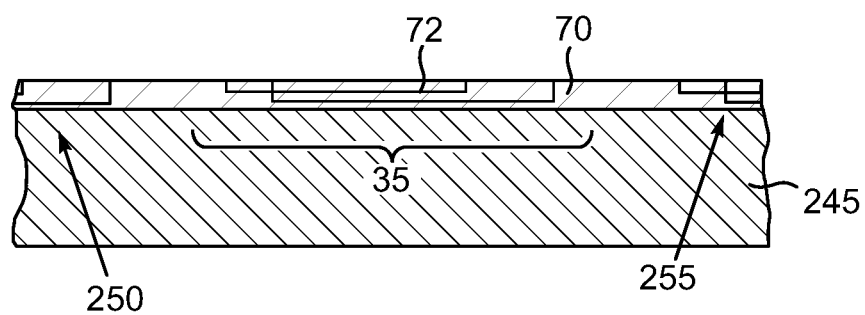
FIG. 9 is a sectional view depicting exemplary interconnect portion fabrication on a semiconductor wafer.

As noted briefly above, the fabrication of the conductive pillars 130 and the fabrication of the interconnect chip 35 can proceed sequentially or in parallel as desired. The fabrication of the interconnect chip 35 will now be described in conjunction with FIGS. 9, 10, 11, 12 and 13 and initially to FIG. 9. FIG. 9 is a sectional view depicting a portion of a semiconductor wafer 245 from which multitudes of interconnect chips 135 can be fabricated on a wafer level basis. For example, the interconnect chip 35 is generally delineated as shown in FIG. 9 and portions of adjacent identical semiconductor chips 250 and 255 are shown as well. At this stage, the semiconductor wafer 245 can be thicker than the final thickness of the interconnect chip 35 following singulation in order to provide more robust mechanical stability for the various operations performed. Initially, the various circuit structures that may be located beneath the interconnect portion 70 are fabricated using well-known processes for fabricating integrated circuits in semiconductor materials. Next and as still shown in FIG. 9, the interconnect portion 70 is fabricated on the wafer 245. This entails well-known dielectric deposition patterning and patterning processes such as CVD and well-known metallization deposition and patterning processes in order to establish the various conductor traces 72. Of course the same types of processes are performed at the other chips 250 and 255 for example. Optionally, there may not be logic circuits beneath the interconnect portion 70.

Figure 10:
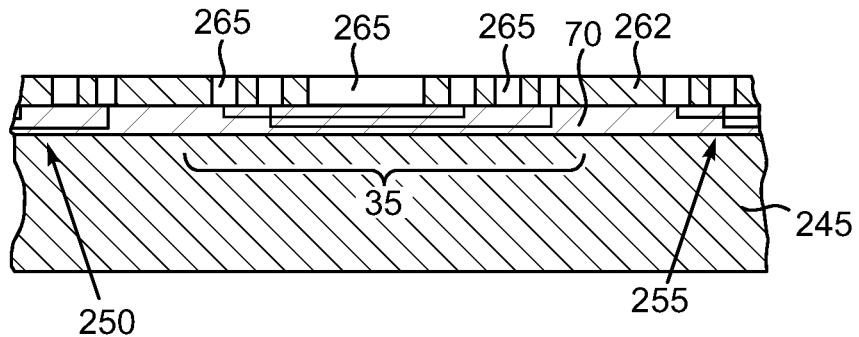
FIG. 10 is a sectional view like FIG. 9 but depicting exemplary initial masking to fabricate conductor traces and other structures on the interconnect portion.

Next and as shown in FIG. 10, a photoresist mask 262 is applied over the interconnect portion 70 on the wafer 245 using well-known spin coating and baking techniques. The photoresist mask 262 is photolithographically patterned to create suitable openings 265. Positive tone or negative tone resists can be used. The openings 265 at the interconnect chip 35 correspond to the locations where the traces 80*a*, 80*b*, 80*c*, 80*d* and 80*e* and the stud 85*a* depicted in FIG. 1 will be fabricated. Of course similar openings (not numbered) will be patterned at the locations of the chips 250 and 255 as well.

Figure 11:
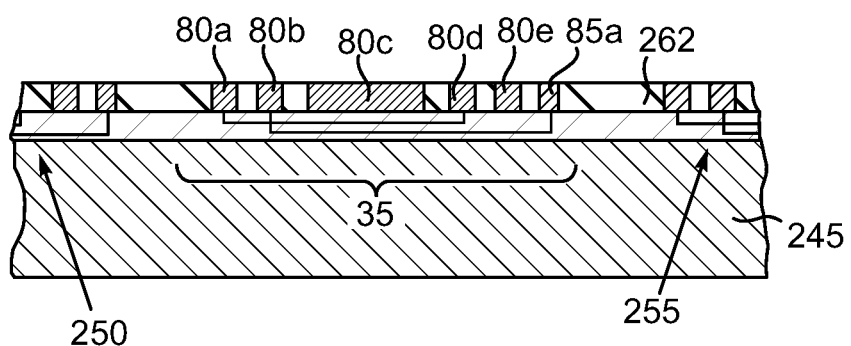
FIG. 11 is a sectional view like FIG. 10 but depicting metal application for the conductor traces etc.

Next and as shown in FIG. 11, a suitable plating process is performed using the photoresist mask 262 to fabricate the traces 80*a*, 80*b*, 80*c*, 80*d* and 80*e* and the stud 85*a*, thus filling the openings 265 depicted in FIG. 10. Of course similar traces (not numbered) will be patterned at the locations of the chips 250 and 255 of the wafer 245 in addition to the interconnect chip 35.

Figure 12:
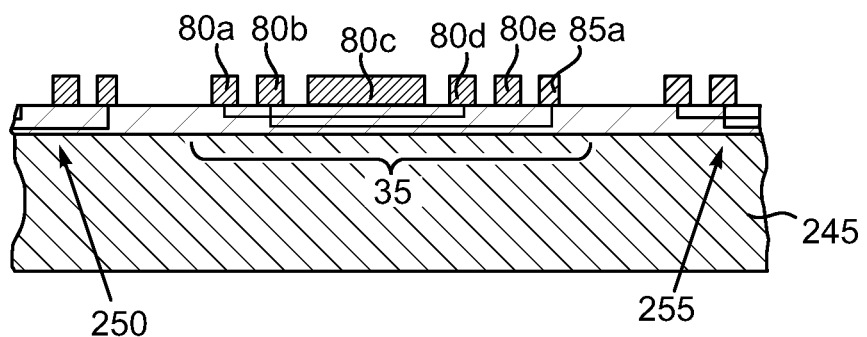
FIG. 12 is a sectional view like FIG. 11 but depicting exemplary mask removal to reveal the fabricated conductor traces and other conductors.

Next and as shown in FIG. 12, the photoresist mask 262 is stripped using well-known ashing and solvent stripping techniques to expose the traces 80*a*, 80*b*, 80*c*, 80*d* and 80*e* and the stud 85*a* of the interconnect chip 35. Of course the similar traces (not numbered) for the chips 250 and 255 of the wafer 245 are similarly exposed.

Figure 13:
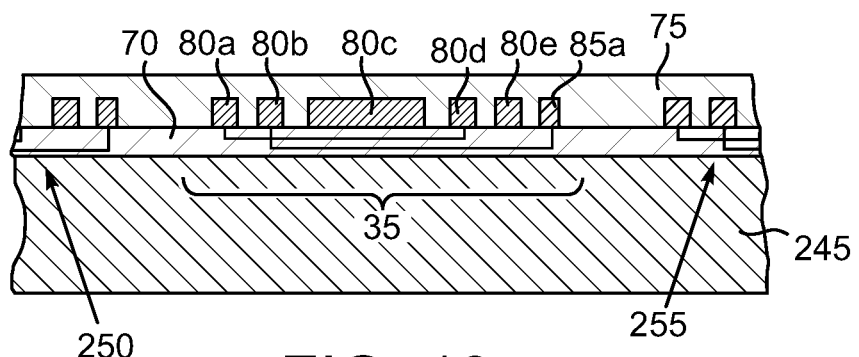
FIG. 13 is a sectional view like FIG. 12 but depicting exemplary polymer layer application.

Next and as shown in FIG. 13, the polymer layer 75 is applied over the traces 80*a*, 80*b*, 80*c*, 80*d* and 80*e* and the stud 85*a* and the otherwise exposed portions of the interconnect portion 70. Note that the polymer layer 75 is applied with a thickness that is greater than the height of the traces 80*a*, 80*b*, 80*c*, 80*d* and 80*e* and stud 85*a*. As described in more detail below, a subsequent grinding process will ultimately reveal the tops of the traces 80*a*, 80*b*, 80*c*, 80*d* and 80*e* and the stud 85*a*. Of course the similar traces (not numbered) for the chips 250 and 255 of the wafer 245 are similarly coated.

Figure 14:
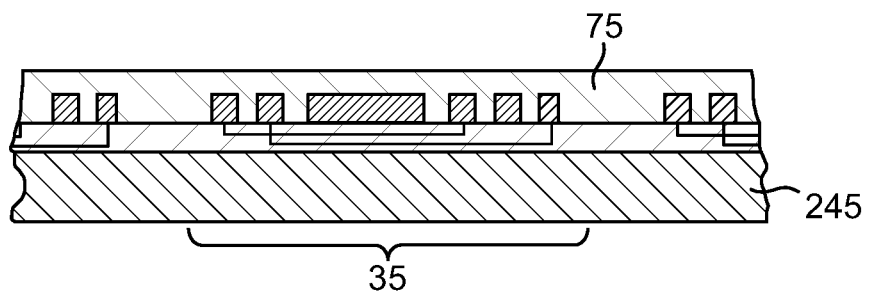
FIG. 14 is a sectional view like FIG. 13 but depicting exemplary semiconductor substrate thinning.

Next and as shown in FIG. 14, the semiconductor wafer 245 undergoes a thinning process, by CMP or grinding or the like, in order to reduce the thickness of the interconnect chip 35 to the thickness that it takes on just prior to mounting with the conductive pillars 130. The polymer layer 75 remains in place and with the initial applied thickness depicted in FIG. 13 as well.

Figure 15:
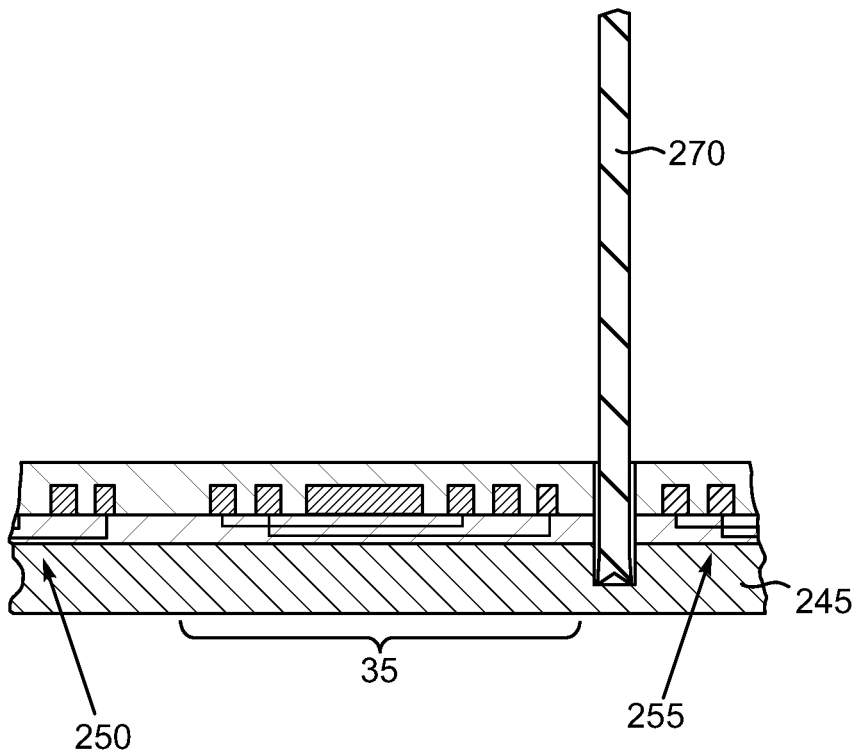
FIG. 15 is a sectional view like FIG. 14 but depicting exemplary singulation of an interconnect chip from a semiconductor wafer.

Next and as shown in FIG. 15, the interconnect chip 35 is singulated from the semiconductor wafer 245 using a suitable dicing saw 270 or other type of the singulation technique. At this stage, the interconnect chip 35 and its neighboring interconnect chips 250 and 255 are ready to be mounted with respective collections of conductive pillars 130.

Figure 16:
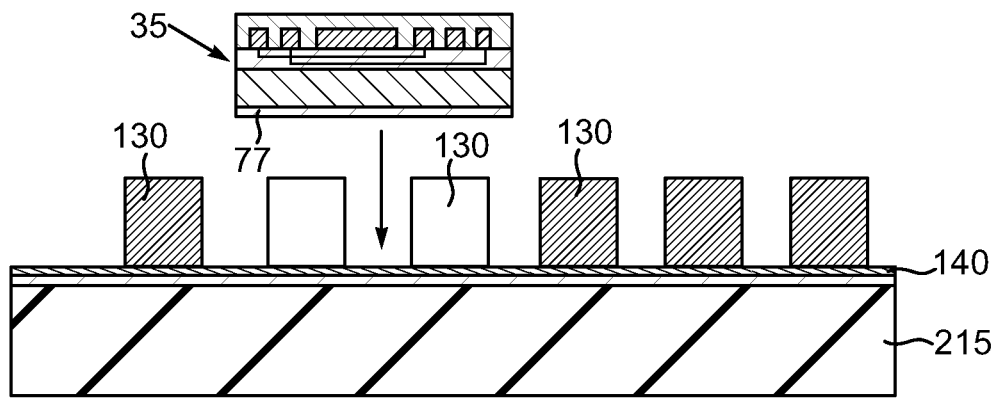
FIG. 16 is a sectional view depicting exemplary mounting of an interconnect chip on the aforementioned carrier wafer in between conductive pillars.

Next and as shown in FIG. 16, the interconnect chip 35 is mounted on combination of the conductive pillars 130, the polymer layer 140 and the carrier wafer 215 constructed in the separate processes described above. The interconnect chip 25 is mounted in front of some of the conductive pillars 130 and of course in between others of the conductive pillars 130. The interconnect chip 35 is secured to the polymer layer 140 by way of the die attach film 77, which can be composed of well-known epoxy adhesives or other die attach film materials.

Figure 17:
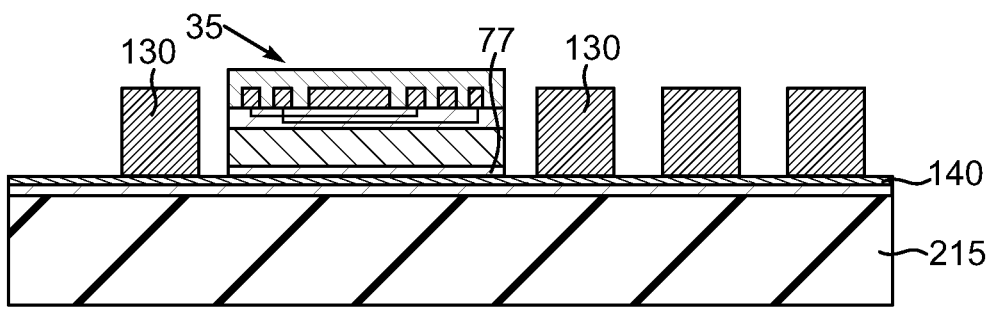
FIG. 17 is a sectional view like FIG. 16 but depicting the mounted interconnect chip.

Next and as shown in FIG. 17, the combination of the carrier wafer 215, the conductive pillars 130 and the interconnect chip 35 undergo a thermal curing process in order to fix the die attach film 77 to the polymer layer 140. The die attach film 77 needs to be robust enough to hold the interconnect chip 35 in position during a subsequent encapsulating molding process.

Figure 18:
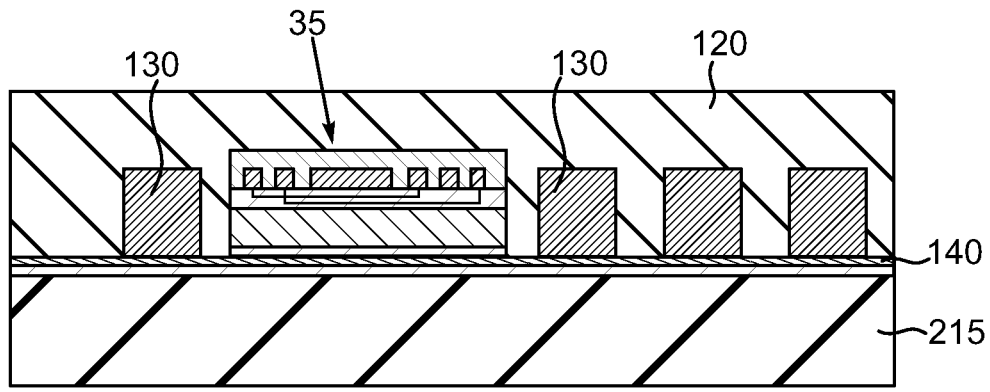
FIG. 18 is a sectional view like FIG. 17 but depicting exemplary molding of a molding layer over the interconnect chip and the conductive pillars.

Next and as shown in FIG. 18, the molding layer 120 is formed over the interconnect chip 35 and the conductive pillars 130 and the otherwise exposed portions of the polymer layer 140. The molding layer 120 can be applied using well-known compression molding techniques. The other depicted structures remain attached to the carrier wafer 215 during this process.

Figure 19:
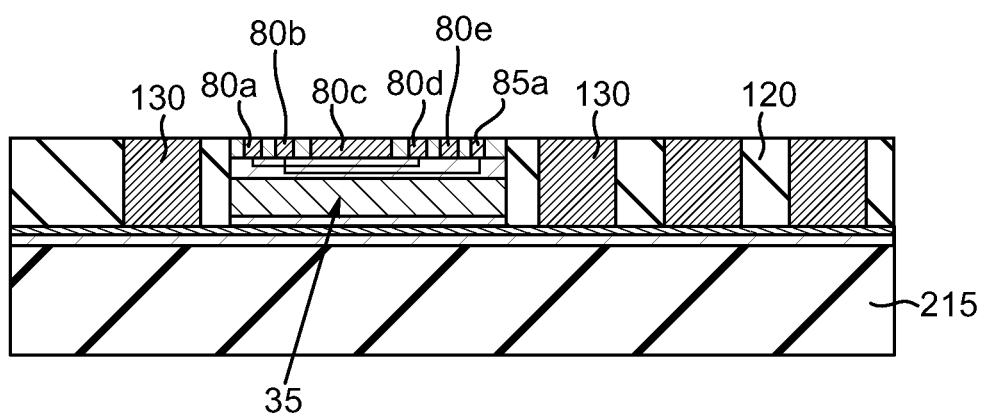
FIG. 19 is a sectional view like FIG. 18 but depicting exemplary thinning of the molding layer.

Next and as shown in FIG. 19, the molding layer 120 undergoes a grinding process to expose the conductive pillars 130. In addition, the grinding process thins the polymer layer 75 so that the formerly covered tops of the traces 80*a*, 80*b*, 80*c*, 80*d* and 80*e* and the stud 85*a* of the interconnect chip 35 are also exposed. It is necessary to expose these various conductor structures in order to be able to establish electrical connections between the subsequently formed vias 110 and those pillars 130 and traces 80*a*, 80*b*, 80*c*, 80*d* and 80*e*, etc.

Figure 20:
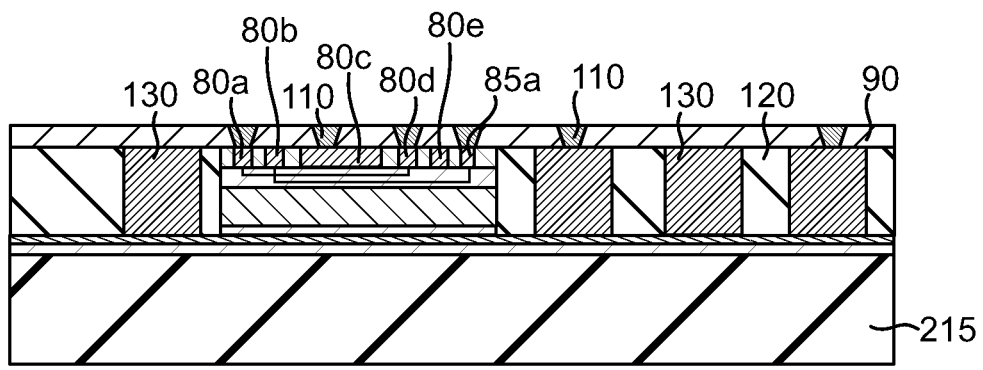
FIG. 20 is a sectional view like FIG. 19 but depicting exemplary initial processing of an RDL structure on the molding layer.

The fabrication of the RDL structure 30 will now be described in conjunction with FIGS. 20, 21, 22 and 23. Referring first to FIG. 20, the dielectric layer 90 is initially fabricated on the molding layer 120 and over the otherwise exposed pillars 130 and the traces 80*a*, 80*b*, 80*c*, 80*d* and 80*e* and the stud 85*a*. The dielectric layer 90 can be applied using well-known spin coating and baking techniques and can be infused with photoactive compounds in order to be able to establish openings for the subsequently plated vias 110. Optionally, openings for the subsequently formed vias 110 can be established by laser drilling or other types of etching techniques. Following establishment of the openings, the vias 110 are fabricated using well-known plating or other material deposition techniques. The carrier wafer 215 remains during these steps.

Figure 21:
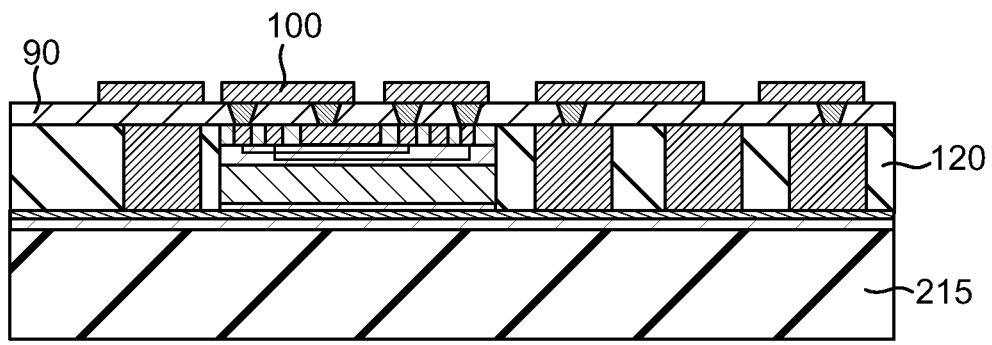
FIG. 21 is a sectional view like FIG. 20 but depicting exemplary additional processing of the RDL structure.

Next and as shown in FIG. 21, the metallization layer 100 is fabricated on the dielectric layer 90. The metallization layer 100 can be an additive or subtractive process. In an exemplary arrangement, the metallization layer 100 is fabricated as a subtractive process in which a blanket layer of metallic material is deposited using well known PVD or CVD techniques and then subsequently etched to define the individual conductor traces of the metallization layer 100. The carrier wafer 215 remains during these steps.

Figure 22:
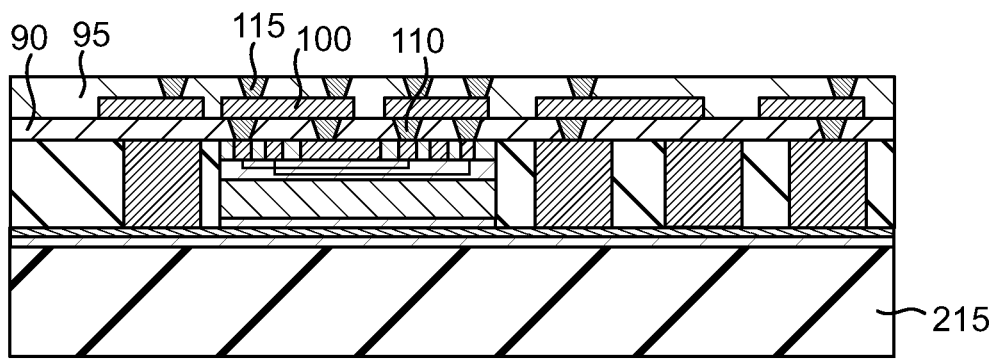
FIG. 22 is a sectional view like FIG. 21 but depicting exemplary additional processing of the RDL structure.

Next and as shown in FIG. 22, the dielectric layer 95 is fabricated over the metallization layer 100 and the exposed portions of the dielectric layer 90. As with the dielectric layer 90, the dielectric layer 95 is processed in order to establish openings for the subsequently formed vias 115. As with the dielectric layer 90, the establishment of these openings for the vias 115 can be by way of laser drilling, photolithography using photoactive compounds for the dielectric layer 95 or other techniques. Subsequently, the vias 115 are established in the openings using the techniques described above for the vias 110. The carrier wafer 215 remains during these steps.

Figure 23:
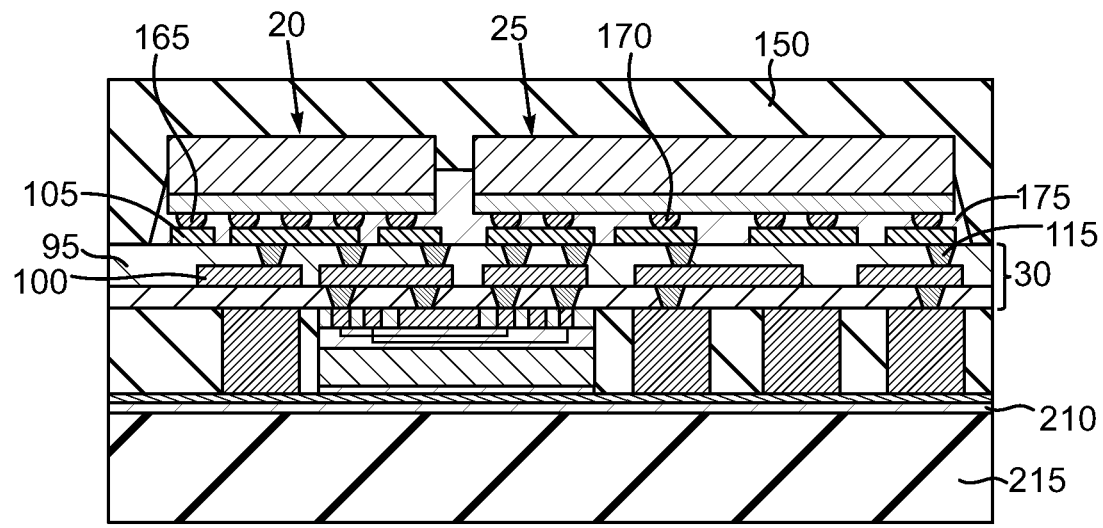
FIG. 23 is a sectional view like FIG. 22 but depicting exemplary semiconductor chip mounting and molding layer fabrication.

Next and as shown in FIG. 23, the metallization layer 105 is fabricated on the dielectric layer 95 and in ohmic contact with various of the vias 115. Again, this process may be an additive or subtractive process. In an exemplary arrangement, the metallization layer 105 is fabricated using the same techniques described above for the metallization layer 100. Next, the semiconductor chips 20 and 25 can be flip-chip mounted on the metallization layer 105 and secured thereto both mechanically and electrically by way of the respective interconnects 165 and 170, this process will typically entail a reflow process in order to temporarily liquify the interconnect structures 165 and 170. The semiconductor chips 20 and 25 are preferably verified as known good die prior to mounting. Next, the underfill material 175 is positioned between the chips 20 and 25 and the RDL structure 30. The underfill 175 can be can be capillary or molded. It can also be possible to pre-apply the underfill 175 and drop the chips 20 and 25 down onto the metallization layer 105. The carrier wafer 215 remains during these steps. Next and still referring to FIG. 23, the molding layer 150 is applied over the semiconductor chips 20 and 25 to at least partially encase those chips on the otherwise exposed portions of the RDL structure 30. The molding can be performed by well-known compression molding techniques.

Figure 24:
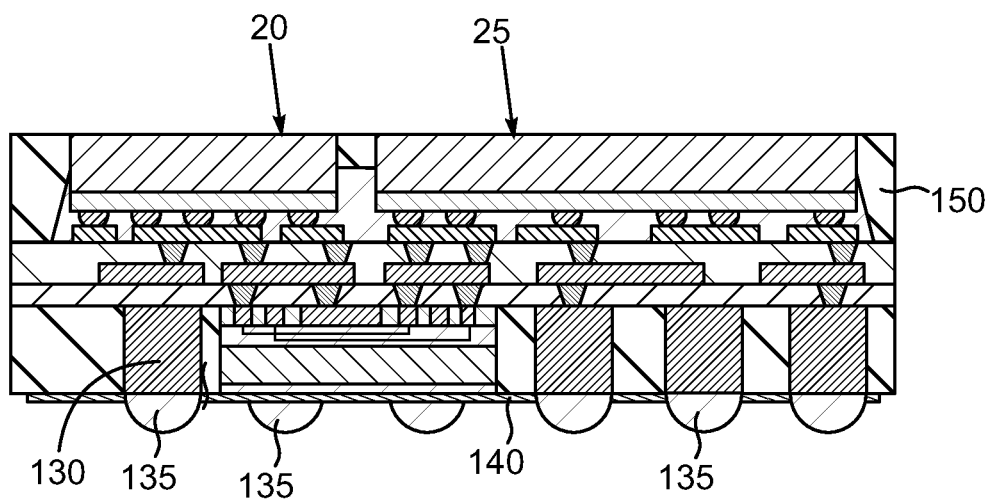
FIG. 24 is a sectional view like FIG. 23 but depicting exemplary thinning of the molding layer.

Next and as shown in FIG. 24, the molding layer 150 can be subjected to a grinding process to expose the upper surfaces of the chips 20 and 25 in anticipation of eventual mounting of some form of heat spreader or sink thereon. In addition, the carrier wafer 215 depicted in FIG. 23 is removed by deactivating the release layer 210. At this point, the polymer layer 140 can be processed to establish openings therein leading to the conductive pillars 130 in anticipation of the attachment of the solder structures 135. Optionally, the polymer layer 140 could be processed earlier to establish the openings. With the openings established in the polymer layer 140, the solder structures 135 can be attached to the conductive pillars 130 by way of pick and place, stencil, or other solder attachment techniques. A reflow can be performed after the initial attachment of the solder structures 135 to solidify the metallurgical bonds there between. At this point, the semiconductor chip device 10 can be mounted on the circuit board 15 as shown in FIG. 1.

Figure 25:
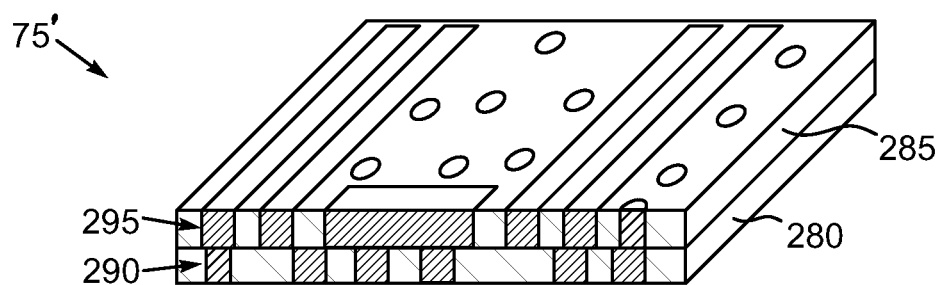
FIG. 25 is a combined sectional and pictorial view of an alternate exemplary arrangement of a polymer layer.

An alternate exemplary arrangement of a polymer layer 75' can be understood by referring now to FIG. 25, which is a combined sectional and pictorial view like that of FIG. 3. Here, the alternate exemplary polymer layer 75' can consist of multiple polymer films, in this case two polymer films 280 and 285 of the same types of polymer discussed above, each populated with plural conductor structures 290 and 295, respectively, such as the aforementioned traces, studs, etc. Utilizing multiple polymer films 280 and 285 and metallization layers 290 and 295 provides even greater capability in terms of lateral routing complexity.

Figure 2:
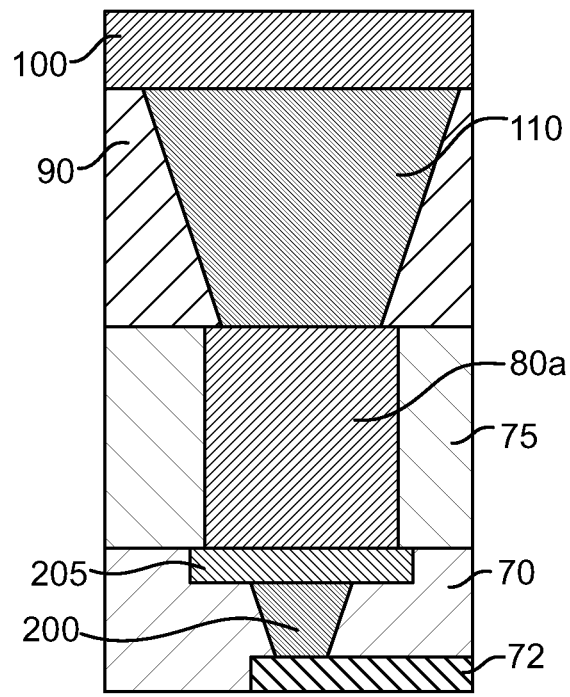
FIG. 2 is a portion of FIG. 1 shown at greater magnification.
Figure 26:
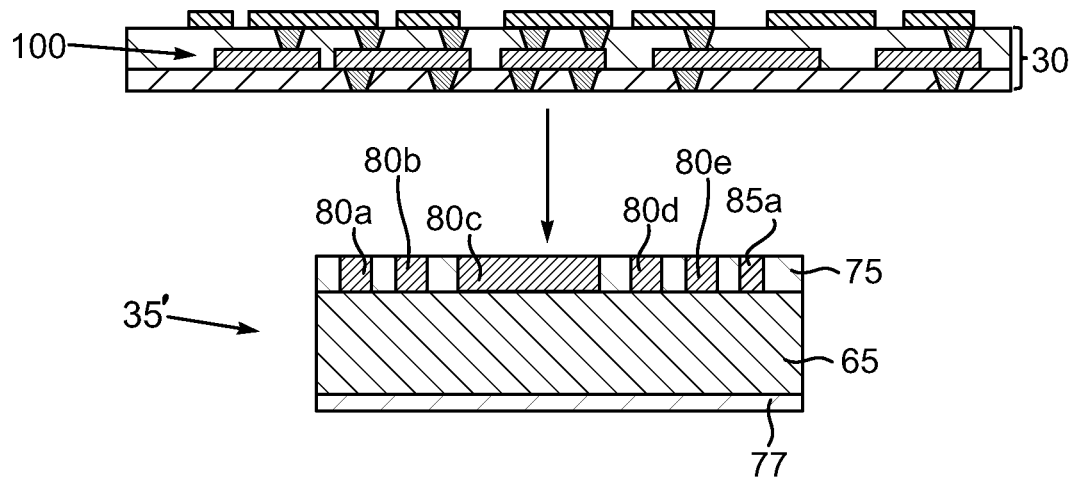
FIG. 26 is a sectional view of an alternate exemplary arrangement of an interconnect chip with a RDL structure exploded therefrom.

In the arrangements described above, the interconnect chip 35 is fabricated with an interconnect portion 70 that includes plural conductor traces 72 as shown in FIG. 2. However, it is possible to fabricate an interconnect chip 35' as shown in FIG. 26 that eliminates the interconnect portion 70 and utilizes the polymer layer 75 and its associated conductor traces 80a, 80b, 80c, 80d and 80e for routing. In this circumstance, the substrate portion 65 can be constructed as a dummy component with attendant improvements in yield and cost over a typical HDCL die. A die attached film 77 can be used as described above in order to secure the interconnect chip 35' to an underlying carrier wafer during fabrication as disclosed above. When the RDL structure 30 is fabricated on the polymer layer 75, the distance between the traces 80a, 80b, 80c, 80d and 80e and the overlying metallization layer 100 of the RDL structure 30 is much smaller than the path lengths if the interconnect portion 70 were implemented on the substrate portion 65. In this way, the inductance of the electrical pathways in the polymer layer will be smaller compared to an arrangement that utilizes the interconnect portion 70.

Figure 27:
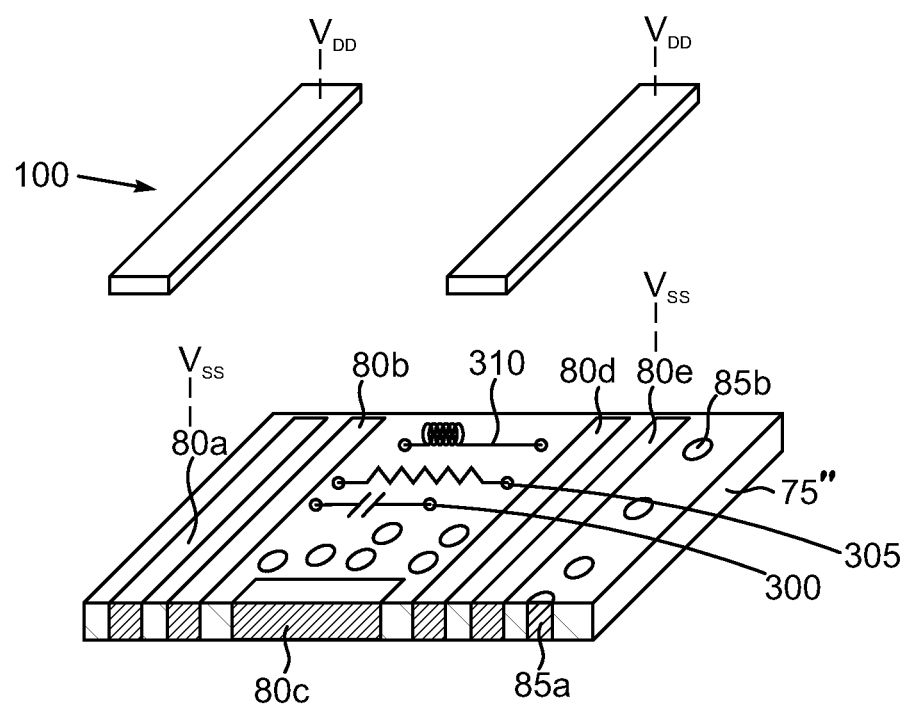
FIG. 27 is a combined sectional and pictorial view of an alternate exemplary arrangement of a polymer layer with a couple of overlying RDL conductor traces shown exploded therefrom.

Another alternate exemplary arrangement of a polymer layer 75" can be understood by referring now to FIG. 27, which is a combined sectional/pictorial view like FIGS. 2 and 25, albeit here with a couple of metallization traces from the overlying metallization layer 100 shown exploded from the corresponding underlying traces 80a and 80e, respectively. FIG. 27 shows that a polymer layer 75" can be constructed with a variety of useful structures, namely, one or more capacitors 300, one or more resistors 305 and one or more inductors 310. The capacitors 300, the resistors 305 and the inductors 310 are depicted schematically, but the skilled artisan will appreciate that these passive structures can be fabricated using the same general techniques utilized to fabricate the other conductor structures in the polymer layer 75", namely, the conductor traces 80a, 80b, 80c, 80d and 80e and the studs 85a, etc. Note that an inductance improvement can be realized if a given trace, such as the trace 80a, is used to route ground ($V_{SS}$) while an overlying conductor of the metallization layer 100 is used to route power ($V_{DD}$) and so on for the trace 80a and the corresponding overlying trace routing power $V_{DD}$. This alignment of power and ground rails provides a cancelling out effect of the magnetic fields induced by a current passing there through and thus yields an overall improvement in inductance levels.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A semiconductor chip device, comprising:
a first molding layer;
an interconnect chip at least partially encased in the first molding layer, the interconnect chip having a first side and a second side opposite the first side and a polymer layer on the first side, the polymer layer including plural conductor traces;
a redistribution layer (RDL) structure positioned on the first molding layer and having plural conductor structures electrically connected to the plural conductor traces, the plural conductor traces providing lateral routing; and
a first semiconductor chip and a second semiconductor chip positioned on the RDL structure, the RDL structure and the interconnect chip electrically connecting the first semiconductor chip to the second semiconductor chip, and a second molding layer at least partially encasing the first semiconductor chip and the second semiconductor chip.

2. The semiconductor chip device of claim 1, wherein the interconnect chip comprises a dummy component.

3. The semiconductor chip device of claim 1, wherein the interconnect chip includes a substrate portion and an interconnect portion positioned between the polymer layer and the substrate portion and having conductor traces electrically connected to the plural conductor traces of the polymer layer.

4. The semiconductor chip device of claim 1, wherein the polymer layer comprises at least one conductive stud.

5. The semiconductor chip device of claim 1, wherein the polymer layer comprises at least one passive component.

6. The semiconductor chip device of claim 1, wherein the polymer layer comprises at least two stacked polymer films, each of the polymer films including plural conductor traces.

7. The semiconductor chip device of claim 1, wherein the first molding layer includes a first plurality of conductive pillars and solder structures connected to the conductive pillars to connect to a circuit board when the semiconductor chip device is mounted on the circuit board.

8. The semiconductor chip device of claim 7, comprising the circuit board, the semiconductor chip device being mounted on the circuit board.

9. The semiconductor chip device of claim 1, wherein the first semiconductor chip comprises a processor and the second semiconductor chip comprises a memory chip.

10. A method of manufacturing a semiconductor chip device, comprising:
fabricating an interconnect chip having a first side and a second side opposite the first side and a polymer layer on the first side, the polymer layer including plural conductor traces;
fabricating a first molding layer around the interconnect chip;

fabricating a redistribution layer (RDL) structure on the first molding layer, the RDL structure having plural conductor structures electrically connected to the plural conductor traces, the plural conductor traces providing lateral routing; and mounting a first semiconductor chip and a second semiconductor chip on the RDL structure, the RDL structure and the interconnect chip electrically connecting the first semiconductor chip to the second semiconductor chip, and fabricating a second molding layer at least partially encasing the first semiconductor chip and the second semiconductor chip.

11. The method of claim 10, wherein the interconnect chip comprises a dummy component.

12. The method of claim 10, wherein the interconnect chip includes a substrate portion and an interconnect portion positioned between the polymer layer and the substrate portion and having conductor traces electrically connected to the plural conductor traces of the polymer layer.

13. The method of claim 10, wherein the polymer layer comprises at least one conductive stud.

14. The method of claim 10, wherein the polymer layer comprises at least one passive component.

15. The method of claim 10, wherein the polymer layer comprises at least two stacked polymer films, each of the polymer films including plural conductor traces.

16. The method of claim 10, wherein the first molding layer includes a first plurality of conductive pillars and solder structures connected to the conductive pillars to connect to a circuit board when the semiconductor chip device is mounted on the circuit board.

17. The method of claim 16, comprising mounting the semiconductor chip device on the circuit board.

18. A method of interconnecting a first semiconductor chip to a second semiconductor chip, comprising:

at least partially encasing an interconnect chip in a first molding layer, the interconnect chip having a first side and a second side opposite the first side and a polymer layer on the first side, the polymer layer including plural conductor traces;

fabricating a redistribution layer (RDL) structure on the first molding layer, the RDL structure having plural conductor structures electrically connected to the plural conductor traces, the plural conductor traces providing lateral routing;

mounting a first semiconductor chip and a second semiconductor chip on the RDL structure after the RDL structure is fabricated; and interconnecting the first semiconductor chip to the second semiconductor chip with the interconnect chip and the RDL structure.

* * * * *